US012618918B2

(12) United States Patent
Vudugula et al.

(10) Patent No.: US 12,618,918 B2
(45) Date of Patent: May 5, 2026

(54) GROUND FAULT DETECTION SYSTEM AND METHOD

(71) Applicant: Transportation IP Holdings, LLC, Norwalk, CT (US)

(72) Inventors: Sai Kumar Vudugula, Bangalore (IN); Rajendra Prasad Chittimalla, Bangalore (IN); Ajith Kuttannair Kumar, Ashburn, VA (US)

(73) Assignee: Transportation IP Holdings, LLC, Norwalk, CT (US)

( * ) Notice: Subject to any disclaimer, the term of this patent is extended or adjusted under 35 U.S.C. 154(b) by 189 days.

(21) Appl. No.: 18/544,843

(22) Filed: Dec. 19, 2023

(65) Prior Publication Data

US 2024/0302452 A1 Sep. 12, 2024

Related U.S. Application Data

(60) Provisional application No. 63/450,484, filed on Mar. 7, 2023.

(51) Int. Cl.
*G01R 31/52* (2020.01)
*G01R 19/165* (2006.01)
*H02M 3/158* (2006.01)

(52) U.S. Cl.
CPC ....... *G01R 31/52* (2020.01); *G01R 19/16576* (2013.01); *H02M 3/158* (2013.01)

(58) Field of Classification Search
None
See application file for complete search history.

(56) References Cited

U.S. PATENT DOCUMENTS

2016/0377670 A1* 12/2016 Tamida ................. G01R 31/52
324/551

FOREIGN PATENT DOCUMENTS

JP 4122858 B2 7/2008
JP 2011019312 A 1/2011

OTHER PUBLICATIONS

European Search Report dated Jul. 5, 2024 for corresponding European Patent Application No. 24151601.2.

* cited by examiner

*Primary Examiner* — Farhana A Hoque
(74) *Attorney, Agent, or Firm* — K&L Gates LLP

(57) ABSTRACT

A ground fault detection system for a power system having a DC link, a battery bank, a link capacitor unit connected to the DC link, and plural power converters connected to the DC link. The power converters convert first DC power from the DC link to at least one of AC power or second DC power for powering at least one electrical load. A control unit disconnects the battery bank from the DC link responsive to detection of a ground fault, to deactivate operation of the power converters, and to sequentially at least partially activate, with power from the link capacitor unit, each of the power converters individually until a sensed voltage signal of the DC link is indicative of the ground fault being associated with one of the power converters.

17 Claims, 1 Drawing Sheet

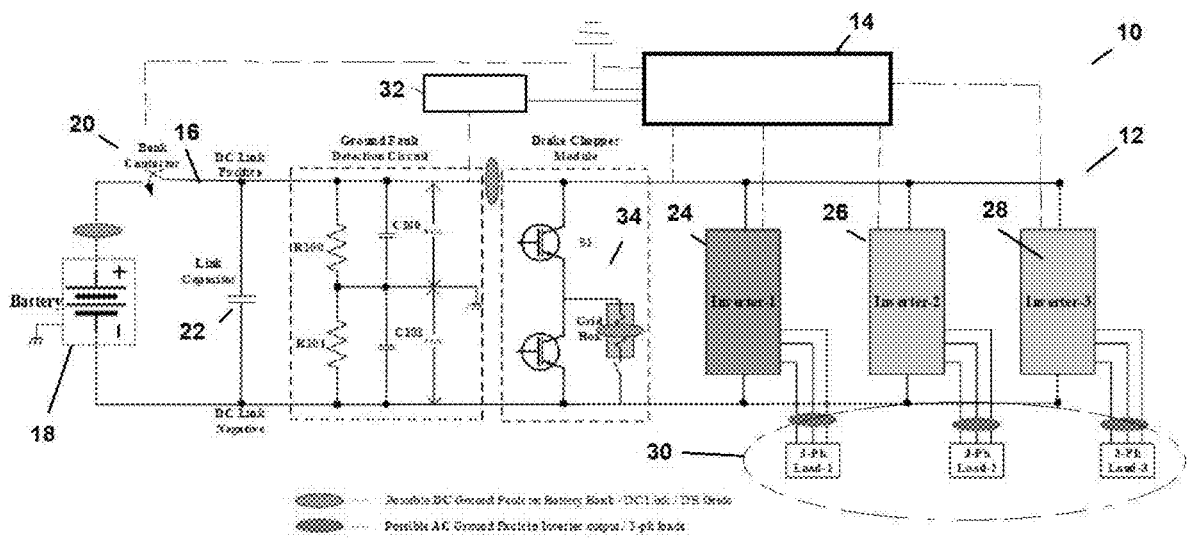

GROUND FAULT DETECTION SYSTEM AND METHOD

CROSS-REFERENCE TO RELATED APPLICATIONS

This application claims priority to U.S. Provisional Application No. 63/450,484 (filed 7 Mar. 2023), the entire disclosure of which is incorporated herein by reference.

BACKGROUND

Technical Field

Embodiments of the present disclosure relate to power systems that provide electrical power to operate a load. Other embodiments relate to detection of ground faults in a power system.

Discussion of Art

Certain power systems are configured to convert one form of electrical energy to a second form of electrical energy that is suitable for electrically powering an electrical load. For example, a stationary power unit may include a fuel engine that combusts a fuel to mechanically drive an electrical generator, and a power conversion circuit that converts electrical power produced by the generator into a different form of electrical power (e.g., DC to AC) to power a load connected to the stationary power unit. In another example, a vehicle may include a battery system that outputs DC power, and a power conversion circuit that converts the DC power to AC power for operating an AC traction motor of the vehicle. All such systems may be subject to ground faults, which are unintentional electrical pathways between a power source and a grounded surface, caused by damaged cables or connections, water contamination, etc. Ground faults may result in damage or even failure of all or part of a power system, and thus require detection and remediation when a power system is in operation (e.g., shutting down the power system when a ground fault is detected). For systems with complex electrical circuits, suitable ground detection functionality may be expensive to implement, and it may be difficult to accurately detect, isolate, and remediate ground faults.

It may be desirable to have a ground fault detection system and method that differ from those that are currently available.

BRIEF DESCRIPTION

In an embodiment, a system (e.g., a ground fault detection system) for a power system includes a control unit configured for operable connection to the power system. The power system includes a DC link, a battery bank selectively connectable to the DC link, a link capacitor unit (e.g., one or more capacitors) connected to the DC link, and plural power converters connected to the DC link. The power converters are configured to convert first DC power from the DC link to at least one of AC power or second DC power for powering at least one electrical load. The control unit is configured, responsive to detection of a ground fault, to disconnect the battery bank from the DC link, to deactivate operation of the power converters, and to sequentially at least partially activate, with power from the link capacitor unit, each of the power converters individually until a sensed voltage signal of the DC link is indicative of the ground fault being associated with one of the power converters.

In an embodiment, a system (e.g., a ground fault detection system) for a power system includes a control unit configured for operable connection to the power system. The power system includes a DC link, a battery bank selectively connectable to the DC link, a link capacitor unit (e.g., one or more capacitors) connected to the DC link, and plural power converters connected to the DC link. The power converters are configured to convert first DC power from the DC link to at least one of AC power or second DC power for powering at least one electrical load. The control unit is configured to determine a DC ground fault based on a comparison of a first DC component of a sensed voltage signal between a terminal of the DC link and a chassis or other electrical ground to a first designated DC threshold. The control unit is further configured to determine an AC ground fault based on a comparison of a first AC component of the sensed voltage signal to a first designated AC threshold. The control unit is further configured, responsive to determination of the AC ground fault or the DC ground fault, to disconnect the battery bank from the DC link and deactivate operation of the power converters, and, responsive to the determination of the AC ground fault, to sequentially at least partially activate, with power from the link capacitor unit, each of the power converters individually until a second DC component of the sensed voltage signal is indicative of the AC ground fault being associated with a first power converter of the plural power converters.

BRIEF DESCRIPTION OF THE DRAWINGS

The subject matter may be understood from reading the following description of non-limiting embodiments, with reference to the attached drawings, wherein below:

FIG. 1 is an electrical schematic diagram of a ground fault detection system operably connected to a power system, according to an embodiment.

DETAILED DESCRIPTION

Examples of the subject matter described herein relate to systems and methods for detecting ground faults in a power system, isolating the ground faults (e.g., determining locations of the ground faults in an electrical circuit), and taking remedial action responsive to the detected/isolated ground faults. The power system may include a battery bank (plural energy storage device cells) and/or other power source (e.g., engine-driven alternator or generator) and power conversion circuitry that is configured to convert one form of electrical power from the battery bank or other power source to a second, different form of electrical power to operate a load. One example is converting DC power from a battery bank to AC power to drive an AC motor or other AC load. Or converting AC power from an alternator to DC power on a DC link, and then converting the DC power from the DC link to a second, different form of AC power to drive an AC motor or other AC load. Other combinations are possible, e.g., DC-to-DC, AC-to-DC-to-DC, etc. In one example, the power system is on board a vehicle that includes a battery bank and one or more traction motors or other electrical loads; the vehicle may or may not have an onboard fuel engine. In one example, the vehicle lacks an onboard fuel engine, with the only onboard source of electrical power being a battery bank. In another example, the vehicle lacks an onboard fuel engine, with the only onboard source of electrical power being a battery bank, but the vehicle may additionally receive electrical power from an off-board source, e.g., a catenary line or third rail or adjacent vehicle, and/or electrical power may be generated on board the vehicle using regenerative or dynamic braking, where traction motors of the vehicle are controlled to operate as generators instead of motors to cause electromagnetic drag and thereby slow the vehicle for braking.

In one embodiment, a system (e.g., a ground fault detection system) for such a power system includes a control unit configured for operable connection to the power system. For example, the power system may include a DC link, a battery bank selectively connectable to the DC link, a link capacitor unit (e.g., one or more capacitors) connected to the DC link, and plural power converters (e.g., inverters and/or rectifiers) connected to the DC link. The power converters are configured to convert "first" DC power from the DC link to at least one of AC power or "second" DC power for powering at least one electrical load. The control unit is configured, responsive to detection of a ground fault, to disconnect the battery bank from the DC link, to deactivate operation of the power converters, and to sequentially at least partially activate, with power from the link capacitor unit, each of the power converters individually until a sensed voltage signal of the DC link is indicative of the ground fault being associated with one of the power converters.

According to one aspect, sequential, individual activation of the power converters may include the power converters, subsequent all the power converters being concurrently deactivated (turned off), being activated one at a time in sequence, one after the other. "At least partial" activation may include each power converter being fully activated, or each power converter being only partially activated. For example, if a power converter includes plural transistors or other semiconductor device switches or other electrically-controlled switches (such as contactors or relays) connected between terminals (e.g., positive and negative) of the DC link, a single one of the switches may be activated (turned on) to electrically connect a load terminal to one of the DC link terminals. Sequential individual (at least partial) activation allows the control unit to assess the effect of individually connecting the load (or loads) to one of the DC link terminals through the various power converters, to isolate which, if any, of the power converters may be responsible for a ground fault.

In another embodiment, the system (e.g., ground fault detection system) for the power system may be configured to assess DC vs. AC ground faults, and to isolate a DC ground fault or an AC ground fault to relevant components in the power system. For example, the system may include a control unit configured for operable connection to the power system. The power system may include a DC link, a battery bank selectively connectable to the DC link, a link capacitor unit (e.g., one or more capacitors) connected to the DC link, and plural power converters connected to the DC link. The power converters are configured to convert first DC power from the DC link to at least one of AC power or second DC power for powering at least one electrical load. The control unit is configured to determine a DC ground fault based on a comparison of a first DC component of a sensed voltage signal between a terminal of the DC link and a chassis or other electrical ground to a first designated DC threshold. The control unit is further configured to determine an AC ground fault based on a comparison of a first AC component of the sensed voltage signal to a first designated AC threshold. The control unit is further configured, responsive to determination of the AC ground fault or the DC ground fault, to disconnect the battery bank from the DC link and deactivate operation of the power converters, and, responsive to the determination of the AC ground fault, to sequentially at least partially activate, with power from the link capacitor unit, each of the power converters individually until a second DC component of the sensed voltage signal is indicative of the AC ground fault being associated with one of the power converters of the plural power converters (e.g., whichever "first" power converter is determined as causing a ground fault).

According to one aspect, after general detection of a ground fault (e.g., AC ground fault or DC ground fault), such as based on a peak/maximum of the DC link-to-ground voltage exceeding a designated threshold, the control unit is configured to determine if the ground fault is an AC ground fault or a DC ground fault (based on comparisons of AC and DC components of the DC link, relative to chassis/ground, to designated AC and DC thresholds, respectively), and to then disconnect the battery bank from the DC link (e.g., by controlling a bank contactor or other switch to an electrically open position) and to control the power converters to a concurrent deactivated state where all the power converters are concurrently turned off. This may prevent damage to the battery bank or other components. The control unit may be configured, responsive to detection of the DC ground fault, to then isolate the DC ground fault, and, responsive to detection of the AC ground fault, to then sequentially individually (at least partially) active the power converters, to isolate the AC ground fault. Because the battery bank is disconnected from the DC link, power for activating the power converters is provided from the link capacitor unit, and thereby activation (e.g., partial activation) of the power converters is carried out within a time period while power is available from the capacitor unit and before the capacitor unit is discharged, e.g., before a voltage level of the DC link (as established by the capacitor unit) falls below a designated threshold.

The control unit includes electrical circuitry and/or a microcontroller having one or more processors with a memory unit that includes stored instructions to operate the one or more processors. The electrical circuitry and/or processors may be configured to receive signals (e.g., sensor signals containing information of aspects of the power system in operation, such as voltage signals between two non-ground points of the power system or between various points of the power system and a vehicle chassis or other electrical ground), and to generate control signals for controlling one or more components of the power system in operation. For example, in embodiments where the power system includes plural power converters, the control unit may be configured to generate control signals to activate and deactivate transistors, other semiconductor device switches, or other switches of the power converters, e.g., signals applied to a gate terminal, base terminal, or other control terminal of a transistor.

With reference to FIG. 1, in an embodiment, a system 10 (e.g., a ground fault detection system) for a power system 12 includes a control unit 14 configured for operable connection to the power system. For example, the power system may include a DC link 16 (having positive and negative lines, busses, or other terminals), a battery bank 18 selectively connectable to the DC link (e.g., via an electrically controllable contactor 20), a link capacitor unit 22 (e.g., one or more capacitors) connected to the DC link, and plural power converters 24, 26, 28 (e.g., inverters and/or rectifiers) connected to the DC link. The power converters are configured to convert "first" DC power from the DC link to at least one of AC power or "second" DC power for powering at least one electrical load 30. (For example, the power system could include three inverters for powering an AC motor(s) or other 3-phase load, or some other number of inverters or other power converters and some other number and type of load.) The control unit is configured, responsive to detection of a ground fault (such as from a sensor 32), to disconnect the battery bank from the DC link, to deactivate operation of the power converters, and to sequentially at least partially activate, with power from the link capacitor unit, each of the power converters individually until a sensed voltage signal of the DC link is indicative of the ground fault being associated with one of the power converters.

In an embodiment, the system 10 is configured to identify a type of ground fault (e.g., DC or AC) and perform a corresponding isolation algorithm without reconnecting the battery bank or exposing it to potentially damaging voltage levels, using charge stored in the DC link capacitor unit. To identify the type of ground fault, the system may be configured to:

The system is configured to sense a sensed voltage signal of the DC link. The sensed voltage signal may include an AC component and a DC component, which may change over time. The sensed voltage signal may be between a positive or negative terminal of the DC link and a vehicle chassis or other electrical ground. Information of the sensed voltage signal may be provided in a sensor signal to the control unit.

A ground fault is generally determined when a peak of a terminal voltage of the DC link (DC link positive to ground, or DC link negative to ground), e.g., a peak of the sensed voltage signal, is more than a first designated threshold, e.g., as sensed by a voltage sensor and communicated to the control unit.

Then, the control unit is configured to determine the ground fault as being a DC ground fault if a DC component of the sensed voltage signal is greater than a second designated threshold for ground detection.

Elsewise, the control unit is configured to determine the ground fault as being an AC ground fault if an AC component of the sensed voltage signal is greater than a third designated threshold for ground detection.

If neither the DC component is greater than the second threshold nor the AC component is greater than the third threshold, then the control unit may be configured to determine the ground fault as a partial DC and partial AC ground fault.

When a ground fault is detected on the DC link, the control unit is configured to disconnect the battery bank from the DC link (e.g., by opening the battery bank contactor) and to deactivate (turn off/shut down) all the active power converters connected to the DC link.

In embodiments, the control unit is further configured to subsequently perform one or more ground isolation algorithms within a relatively short time period (e.g., less than a few seconds) while DC link voltage is available from the capacitor unit.

In one embodiment, the control unit may be configured to isolate/determine the grounded component before the DC link voltage, after disconnection of the battery bank, falls below a designated voltage level. In one aspect for a typical rail vehicle application, the designated voltage level may be at least 250 volts. Therefore, in such an embodiment, the control unit would be configured to determine the component causing the ground fault before the DC link goes below 250 volts. For example, for a DC link capacitance of 4.5 mF, a bleeder resistance of 3 kiloohms, and a DC link voltage of 1000V at the time of identifying the ground fault, the time to reach 250 volts would be less than 20 seconds.

To isolate a DC ground fault, the control unit, in embodiments, is configured, once a DC ground fault is detected and the battery bank is disconnected, to determine a DC component of the sensed voltage signal (between a DC link terminal and ground) after a first designated time period. (In some embodiments, the power system, if onboard a vehicle, may include a dynamic braking dissipation system having a resistor grid and associated circuitry for, in certain modes of operation, dissipating dynamic braking electrical energy. In such a system, the control unit may be further configured to also electrically disconnect the dynamic braking dissipation system from the DC link after detection of a ground fault.) The control unit is further configured to:

If the DC component is more than a fourth designated threshold, to identify the DC ground fault on the DC link.

If the DC component is less than the fourth threshold, it may be a possible ground fault on dynamic braking dissipation system or the battery bank. To check the dynamic braking dissipation system, the control unit is configured to reconnect the dynamic braking dissipation system to the DC link. If the DC component is more than the fourth threshold (or, in embodiments, a fifth designated threshold) after a second designated time period after reconnection of the dynamic braking dissipation system, the control unit is configured to identify the DC ground fault on the dynamic braking dissipation system.

If the DC component is less than the fourth (or fifth) threshold, it may be a possible ground fault on the battery bank. In response, the control unit is configured to request that a battery management system of the power system perform a ground self-test on the battery bank. If the ground fault is detected by the battery system, the control unit is configured to identify the DC ground fault on the battery bank.

If no DC ground fault is detected by the battery system, the control unit is configured to generate a signal indicating that the DC ground fault could not be isolated.

To isolate an AC ground fault, in embodiments the control unit is configured to activate single transistors or other switches of the power converters (e.g., single IGBT of an inverter module) by utilizing the charged capacitor voltage of the link capacitor unit. The battery bank will be disconnected from the DC link (e.g., contactor will be in open position) when performing this isolation, so that the batteries of the battery bank will not be re-exposed to higher voltages. As all the inverters or other power converters are disabled on the DC link, the control unit is configured to at least partially activate the power converters only one at a time and one after the other.

In one embodiment, the control unit is configured to activate a first one of the transistors or other switches of one of the power converters. After a third designated time period, the control unit ascertains a DC component of the sensed voltage signal (between a DC link terminal and ground). If the DC component is more than a designated sixth threshold, the control unit is configured to deactivate the transistor or other switch and identify the AC ground fault in association with the first power converter, and thereafter restrict that inverter from powering during operation of the power system. The isolation algorithm is then exited, and the control unit is configured to continue to power up the system with other healthy inverters/loads.

The same procedure is repeated for the other power converters on the DC link. If the AC ground fault could not be isolated to any inverter/load, the control unit is configured to generate a signal indicating the AC ground fault could not be isolated.

In embodiments, if the DC link voltage drops below the designated voltage threshold (e.g., 250 volts), the control unit is configured to stop activating the switch(es) of the currently activated power converter, and to charge the link capacitor unit by reconnecting the battery bank. The battery bank is again disconnected from the DC link once the capacitor unit is charged, and the control unit continues with the isolation algorithm.

The third designated time period (the time after which the DC component of the sensed voltage signal is assessed after activating a transistor or other switch of a power converter) is the time after which the DC ground voltage will reach steady state value due to the filters in control system. (Based on the filter time constant used, the third designated time period will vary.) For example, the third designated time period may be the time it takes for the DC component to reach a steady-state value after a transistor of a power converter is activated. In a typical system, just as one example, the third designated time period may be 200 ms.

In embodiments, the control unit is configured to at least periodically calculate or normalize both AC and DC thresholds based on available DC link voltage.

In one aspect, the thresholds noted herein may be the same or they may be different, depending on the particular system configuration. Thus, "first," "second, "third," etc. thresholds does not mean the thresholds are necessarily different.

As used herein, an element or step recited in the singular and proceeded with the word "a" or "an" do not exclude the plural of said elements or operations, unless such exclusion is explicitly stated. Furthermore, references to "one embodiment" of the invention do not exclude the existence of additional embodiments that incorporate the recited features. Moreover, unless explicitly stated to the contrary, embodiments "comprising," "comprises," "including," "includes," "having," or "has" an element or a plurality of elements having a particular property may include additional such elements not having that property. In the appended claims, the terms "including" and "in which" are used as the plain-English equivalents of the respective terms "comprising" and "wherein." Moreover, in the following claims, the terms "first," "second," and "third," etc. are used merely as labels, and do not impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function devoid of further structure.

Use of phrases such as "one or more of . . . and," "one or more of . . . or," "at least one of . . . and," and "at least one of . . . or" are meant to encompass including only a single one of the items used in connection with the phrase, at least one of each one of the items used in connection with the phrase, or multiple ones of any or each of the items used in connection with the phrase. For example, "one or more of A, B, and C," "one or more of A, B, or C," "at least one of A, B, and C," and "at least one of A, B, or C" each can mean (1) at least one A, (2) at least one B, (3) at least one C, (4) at least one A and at least one B, (5) at least one A, at least one B, and at least one C, (6) at least one B and at least one C, or (7) at least one A and at least one C.

The above description is illustrative, and not restrictive. For example, the above-described embodiments (and/or aspects thereof) may be used in combination with each other. In addition, many modifications may be made to adapt a particular situation or material to the teachings of the subject matter without departing from its scope. While the dimensions and types of materials described herein define the parameters of the subject matter, they are exemplary embodiments. Other embodiments will be apparent to one of ordinary skill in the art upon reviewing the above description. The scope of the subject matter should, therefore, be determined with reference to the appended claims, along with the full scope of equivalents to which such claims are entitled.

This written description uses examples to disclose several embodiments of the subject matter, including the best mode, and to enable one of ordinary skill in the art to practice the embodiments of subject matter, including making and using any devices or systems and performing any incorporated methods. The patentable scope of the subject matter is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal languages of the claims.

What is claimed is:

1. A system comprising:
   a power system having a DC link, a battery bank selectively connectable to the DC link, a link capacitor unit connected to the DC link, and power converters connected to the DC link, the power converters configured to convert first DC power from the DC link to at least one of AC power or second DC power for powering at least one electrical load; and
   a control unit operably connected to the power system, wherein the control unit is configured to:
      responsive to detection of a ground fault, to disconnect the battery bank from the DC link, to deactivate operation of the power converters, and to sequentially at least partially activate, with power from the link capacitor unit, each of the power converters individually until a sensed voltage signal of the DC link is indicative of the ground fault being associated with a first power converter of the power converters, wherein the sensed voltage signal comprises a first DC voltage component of the DC link after sequential individual activation of the first power converter;
      determine that the sensed voltage signal is indicative of the ground fault being associated with the first power converter responsive to the first DC voltage component being greater than a first designated threshold; and
      responsive to the detection of the ground fault, compare a second DC voltage component of the DC link to a second threshold, and identify the ground fault as a DC ground fault responsive to the second DC voltage component being greater than the second threshold.

2. The system of claim 1, wherein the first DC voltage component is between a terminal of the DC link and a vehicle chassis or other electrical ground.

3. The system of claim 1, wherein the control unit is configured to determine that the sensed voltage signal is indicative of the ground fault being associated with the first power converter responsive to the first DC voltage component being greater than the first designated threshold at the end of a first designated time period from when the first power converter is individually sequentially at least partially activated.

4. The system of claim 1, wherein the control unit is further configured, responsive to the sensed voltage signal being indicative of the ground fault associated with the first power converter, to control continued deactivation of the first power converter for operation of the power system to power the at least one electrical load without using the first power converter.

5. The system of claim 1, wherein the control unit is configured to sequentially at least partially activate all the power converters individually within a time period of when power is available from the link capacitor unit without electrical connection to the battery bank.

6. The system of claim 5, wherein the control unit is configured to sequentially at least partially activate all the power converters individually before a voltage level on the DC link falls below a designated voltage level that is greater than zero volts.

7. The system of claim 1, when for each power converter of the power converters that is sequentially at least partially activated, the control unit is configured to activate a single semiconductor device or other electrically-controllable switch of the power converters to electrically connect a terminal of one of the at least one electrical load to the DC link.

8. The system of claim 1, wherein the control unit is further configured, responsive to the detection of the ground fault, to compare an AC component of the DC link to a third threshold, and to identify the ground fault as an AC ground fault responsive to the AC component being greater than the third threshold.

9. The system of claim 8, wherein the control unit is further configured, responsive to identifying the DC ground fault and after disconnection of the battery bank from the DC link, to conduct a comparison of a third DC voltage component of the DC link that is present on the DC link at the end of a designated non-zero time period after the battery bank is disconnected from the DC link to a fourth threshold, and to identify the DC ground fault as being associated with one of the battery bank or the DC link based on the comparison.

10. The system of claim 8, wherein the control unit is further configured, responsive to identifying the DC ground fault and after disconnection of the battery bank and disconnection of a dynamic braking resistor grid from the DC link, to conduct a comparison of a third DC voltage component of the DC link that is present on the DC link at the end of a designated non-zero time period after the battery bank is disconnected from the DC link to a fourth threshold, and to identify the DC ground fault as being associated with the DC link responsive to the third DC voltage component being greater than the fourth threshold and to identify the DC ground fault as being associated with one of the battery bank or the dynamic braking resistor grid responsive to the third DC voltage component being less than the fourth threshold.

11. The system of claim 10, wherein the control unit is further configured, responsive to the DC ground fault being associated with one of the battery bank or the dynamic braking resistor grid, to control electrical connection of the dynamic braking resistor grid to the DC link and to identify the DC ground fault as being associated with the dynamic braking resistor grid responsive to a fourth DC voltage component of the DC link being greater than a fifth threshold.

12. The system of claim 1, wherein the control unit is further configured to determine an AC ground fault based on a comparison of a first AC component of the sensed voltage signal to a first designated AC threshold.

13. The system of claim 12, wherein the control unit is further configured, responsive to determination of the AC ground fault or the DC ground fault, to disconnect the battery bank from the DC link and deactivate operation of the power converters, and, responsive to the determination of the AC ground fault, to sequentially at least partially activate, with power from the link capacitor unit, each of the power converters individually until a second DC component of the sensed voltage signal is indicative of the AC ground fault being associated with the first power converter of the power converters.

14. A system comprising:
a power system having a DC link, a battery bank selectively connectable to the DC link, a link capacitor unit connected to the DC link, and power converters connected to the DC link, the power converters configured to convert first DC power from the DC link to at least one of AC power or second DC power for powering at least one electrical load; and
a control unit operably connected to the power system, wherein the control unit is configured to:
determine a ground fault based on a comparison of a first DC component of a sensed voltage signal between a terminal of the DC link and a chassis or other electrical ground to a first designated DC threshold, and responsive to detection of the ground fault, compare a second DC voltage component of the DC link to a second threshold, and identify the ground fault as a DC ground fault responsive to the second DC voltage component being greater than the second threshold;
determine an AC ground fault based on a comparison of a first AC component of the sensed voltage signal to a first designated AC threshold;
responsive to determination of the AC ground fault or the DC ground fault, to disconnect the battery bank from the DC link and deactivate operation of the power converters; and
responsive to the determination of the AC ground fault, to sequentially at least partially activate, with power from the link capacitor unit, each of the power converters individually until a second DC component of the sensed voltage signal is indicative of the AC ground fault being associated with a first power converter of the power converters.

15. A method comprising:
disconnecting, by a control unit operably connected to a power system, a battery bank of the power system from a DC link of the power system responsive to detection of a ground fault by the control unit;
deactivating operation of power converters that convert power from the DC link for operation of at least one load of the power system;
sequentially at least partially activating, by the control unit, with power from a link capacitor unit of the power system, each of the power converters individually until a sensed voltage signal of the DC link is indicative of the ground fault being associated with a first power converter of the power converters, wherein the sensed voltage signal comprises a first DC voltage component of the DC link after sequential individual activation of the first power converter, and the control unit is configured to determine that the sensed voltage signal is indicative of the ground fault being associated with the first power converter responsive to the first DC voltage component being greater than a first designated threshold;

responsive to the detection of the ground fault, comparing, by the control unit, a second DC voltage component of the DC link to a second threshold; and identifying, by the control unit, the ground fault as a DC ground fault responsive to the second DC voltage component being greater than the second threshold.

16. A method comprising:

determining, by a control unit operably connected to a power system, a DC ground fault based on a comparison of a first DC component of a sensed voltage signal between a terminal of a DC link and a chassis or other electrical ground to a first designated DC threshold;

determining, by the control unit, an AC ground fault based on a comparison of a first AC component of the sensed voltage signal to a first designated AC threshold;

responsive to determination of the AC ground fault or the DC ground fault, disconnecting, by the control unit, a battery bank from the DC link and deactivating operation of power converters of the power system that covert power from the DC link for operating at least one load of the power system; and responsive to the determination of the AC ground fault, sequentially at least partially activating, by the control unit, with power from a link capacitor unit of the power system, each of the power converters individually until a second DC voltage component of the sensed voltage signal is indicative of the AC ground fault being associated with a first power converter of the power converters, wherein the second DC voltage component of the DC link is compared to a second threshold, and identified the AC ground fault responsive to the second DC voltage component being greater than the second threshold.

17. The method of claim 16, wherein the power system comprises a vehicle and the at least one load comprises a traction motor.

*    *    *    *    *